(12) United States Patent
Tang et al.

(10) Patent No.: US 11,768,279 B2
(45) Date of Patent: *Sep. 26, 2023

(54) TECHNIQUES FOR COMPACT LIDAR SYSTEM

(71) Applicant: AEVA, INC., Mountain View, CA (US)

(72) Inventors: Zhizhong Tang, San Carlos, CA (US); Pradeep Srinivasan, Fremont, CA (US); Bing Shen, Sunnyvale, CA (US)

(73) Assignee: Aeva, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/849,219

(22) Filed: Jun. 24, 2022

(65) Prior Publication Data

US 2023/0106643 A1    Apr. 6, 2023

Related U.S. Application Data

(63) Continuation of application No. 17/494,679, filed on Oct. 5, 2021, now Pat. No. 11,378,664.

(51) Int. Cl.
| | |
|---|---|
| *G01S 7/481* | (2006.01) |
| *H01L 25/16* | (2023.01) |
| *G01S 7/4863* | (2020.01) |
| *G01S 17/32* | (2020.01) |
| *G01S 17/89* | (2020.01) |
| *H01L 21/60* | (2006.01) |

(52) U.S. Cl.
CPC .......... *G01S 7/4863* (2013.01); *G01S 7/4814* (2013.01); *G01S 7/4816* (2013.01); *G01S 17/32* (2013.01); *G01S 17/89* (2013.01); *H01L 21/60* (2021.08); *H01L 25/167* (2013.01)

(58) Field of Classification Search
CPC ........ G01S 7/4863; G01S 17/32; G01S 17/89; G01S 7/4816; G01S 7/4814; G01S 17/34; G01S 17/42; G01S 7/4811; H01L 21/60; H01L 25/167; H01L 2224/16225; H01L 2924/15311
USPC ....................................................... 356/5.01
See application file for complete search history.

(56) References Cited

U.S. PATENT DOCUMENTS

| | | | |
|---|---|---|---|
| 11,378,664 B1 * | 7/2022 | Tang | ...................... G01S 17/34 |
| 2017/0288780 A1 | 10/2017 | Yim et al. | |
| 2020/0284883 A1 | 9/2020 | Ferreira et al. | |

\* cited by examiner

*Primary Examiner* — Daniel L Murphy
(74) *Attorney, Agent, or Firm* — Womble Bond Dickinson (US) LLP

(57) ABSTRACT

A light detection and ranging (LIDAR) system and apparatus including a photonics chip mounted to a substrate, the photonics chip including one or more optical components and one or more electrical components and one or more integrated circuit (IC) chips mounted to the photonics chip to process an electrical signal generated by the one or more optical components and the one or more electrical components, wherein the one or more IC chips are physically separated from the substrate to reduce crosstalk on the LIDAR apparatus.

21 Claims, 10 Drawing Sheets

TECHNIQUES FOR COMPACT LIDAR SYSTEM

CROSS-REFERENCE TO RELATED APPLICATIONS

This application is a continuation of U.S. application Ser. No. 17/494,679, filed on Oct. 5, 2021, which is hereby incorporated by reference.

FIELD

The present disclosure is related to LIDAR (light detection and ranging) systems in general, and more particularly to a compact optical sensing module with hybrid multi-chip integration.

BACKGROUND

Frequency-Modulated Continuous-Wave (FMCW) LIDAR systems use tunable, infrared lasers for frequency-chirped illumination of targets, and coherent receivers for detection of backscattered or reflected light from the targets that are combined with a local copy of the transmitted signal. Mixing the local copy with the return signal, delayed by the round-trip time to the target and back, generates signals at the receiver with frequencies that are proportional to the distance to each target in the field of view of the system.

SUMMARY

The present disclosure describes examples of a system and apparatus including a compact optical sensing module with hybrid multi-chip integration.

In some embodiments, a light detection and radar (LIDAR) apparatus includes a photonics chip coupled to a substrate, the photonics chip including an optical source to generate an optical beam, a waveguide to direct the optical beam through the photonics chip, a photodetector to generate an electrical signal in response to detecting a return signal, and an optical coupler to transmit the optical beam from the waveguide to a target in a field of view of the LIDAR apparatus. The LIDAR apparatus further includes one or more integrated circuit (IC) chips coupled to the photonics chip via the substrate, the one or more IC chips to process the electrical signal generated by the photodetector.

In some embodiments, the photonics chip is coupled to the substrate by a first plurality of solder connections and the one or more IC chips are coupled to the photonics chip by a second plurality of solder connections. In some embodiments, the substrate includes a printed circuit board (PCB), a multi-later organic type high density interconnect substrate, or a ceramic multi-layer substrate. In some embodiments, the LIDAR apparatus further includes a processing device physically coupled to the substrate and operatively coupled to the photonics chip to further process the electrical signal generated by the photodetector. In some embodiments, the processing device is to determine one or more properties of the target in the field of view of the LIDAR apparatus based on the electrical signal generated by the photodetector. In some embodiments, the photonics chip is flip-chip bonded to the substrate and the one or more IC chips coupled to the photonics chip are disposed between the substrate and the photonics chip.

In some embodiments, the photonics chip includes a plurality of through-silicon vias (TSVs) from a bottom surface of the photonics chip to a top surface of the photonics chip, the plurality of TSVs to electrically couple the one or more IC chips disposed on a top surface of the photonics chip to the substrate. In some embodiments, the one or more IC chips include at least one application specific integrated circuit (ASIC). In some embodiments, the at least one ASIC includes a TIA chip, a laser chip, or an SOA gain chip. In some embodiments, the optical coupler includes at least one of an edge coupler to provide a one-dimensional optical output array from the photonics chip or a grating coupler to provide a two-dimensional output array from the photonics chip.

In one embodiment, a LIDAR system includes a photonics chip coupled to a substrate, the photonics chip including an optical source to generate an optical beam, a waveguide to direct the optical beam through the photonics chip, a photodetector to generate an electrical signal in response to detecting a return signal, and an optical coupler to transmit the optical beam from the waveguide to a target in a field of view of the LIDAR system. The LIDAR system further includes one or more integrated circuit (IC) chips coupled to the photonics chip via the substrate, the one or more IC chips to process the electrical signal generated by the photodetector.

In one embodiment, a method includes attaching an integrated circuit (IC) chip to a surface of a photonics chip, the photonics chip including a plurality of integrated optic components. The method further includes attaching the photonics chip to a printed circuit board (PCB) to electrically couple the photonics chip with the PCB and attaching a processing device to the PCB to be electrically coupled with the photonics chip via electrical circuits of the PCB.

BRIEF DESCRIPTION OF THE DRAWINGS

For a more complete understanding of various examples, reference is now made to the following detailed description taken in connection with the accompanying drawings in which like identifiers correspond to like elements.

DETAILED DESCRIPTION

The present disclosure describes various examples of compact LIDAR systems and apparatus with multi-chip integration. According to some embodiments, the described LIDAR system described herein may be implemented in any sensing market, such as, but not limited to, transportation, manufacturing, metrology, medical, virtual reality, augmented reality, and security systems. According to some embodiments, the described LIDAR system is implemented as part of a front-end of frequency modulated continuous-wave (FMCW) device that assists with spatial awareness for automated driver assist systems, or self-driving vehicles.

Figure 1:
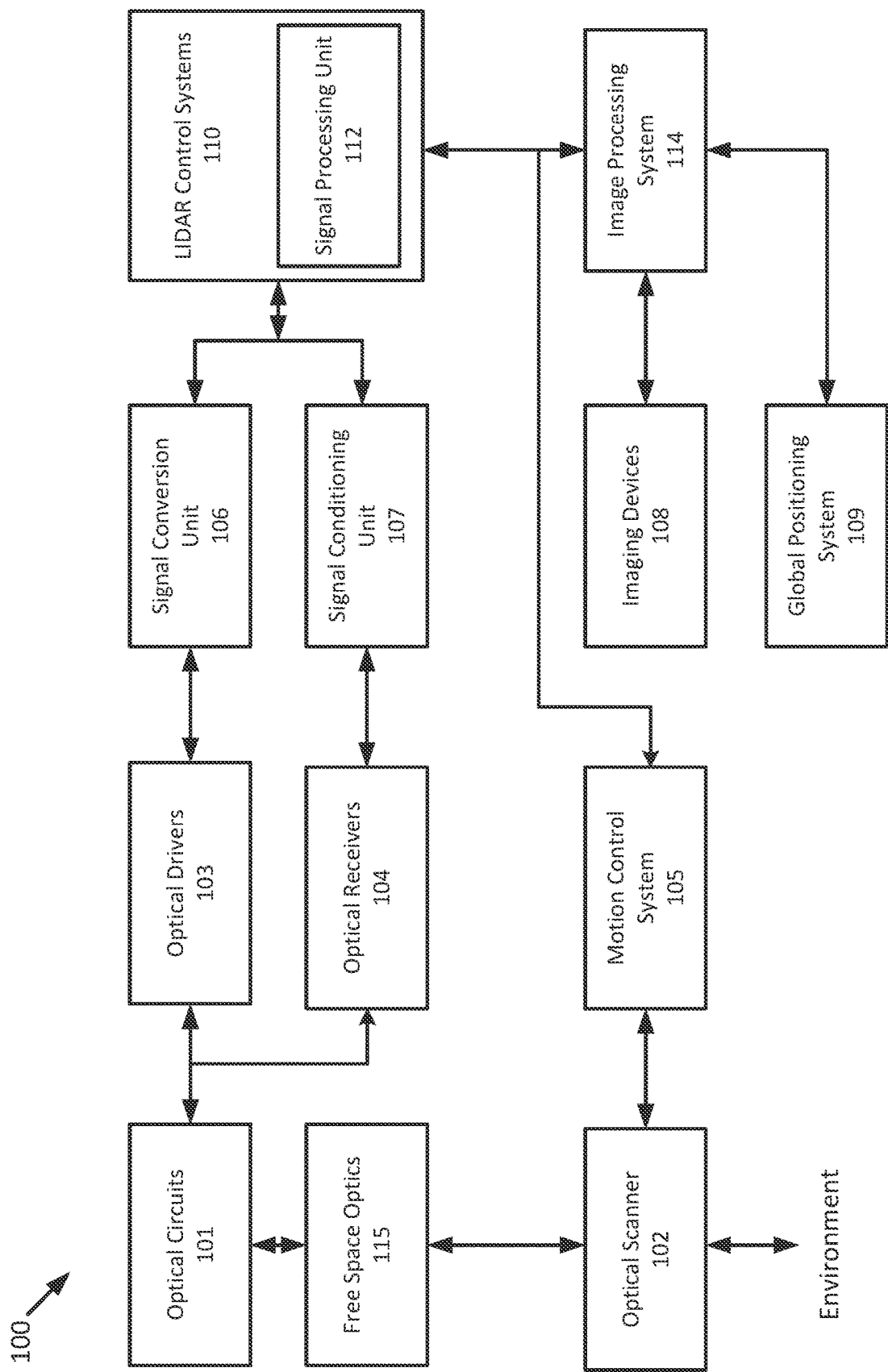
FIG. 1 is a block diagram illustrating an example LIDAR system according to embodiments of the present disclosure.

FIG. 1 illustrates a LIDAR system 100 according to example implementations of the present disclosure. The LIDAR system 100 includes one or more of each of a number of components, but may include fewer or additional components than shown in FIG. 1. One or more of the components depicted in FIG. 1 can be implemented on a photonics chip, according to some embodiments. The optical circuits 101 may include a combination of active optical components and passive optical components. Active optical components may generate, amplify, and/or detect optical signals and the like. In some examples, the active optical component includes optical beams at different wavelengths, and includes one or more optical amplifiers, one or more optical detectors, or the like.

Free space optics 115 may include one or more optical waveguides to carry optical signals, and route and manipulate optical signals to appropriate input/output ports of the active optical circuit. The free space optics 115 may also include one or more optical components such as taps, wavelength division multiplexers (WDM), splitters/combiners, polarization beam splitters (PBS), collimators, couplers or the like. In some examples, the free space optics 115 may include components to transform the polarization state and direct received polarized light to optical detectors using a PBS, for example. The free space optics 115 may further include a diffractive element to deflect optical beams having different frequencies at different angles along an axis (e.g., a fast-axis).

In some examples, the LIDAR system 100 includes an optical scanner 102 that includes one or more scanning mirrors that are rotatable along an axis (e.g., a slow-axis) that is orthogonal or substantially orthogonal to the fast-axis of the diffractive element to steer optical signals to scan an environment according to a scanning pattern. For instance, the scanning mirrors may be rotatable by one or more galvanometers. Objects in the target environment may scatter an incident light into a return optical beam or a target return signal. The optical scanner 102 also collects the return optical beam or the target return signal, which may be returned to the passive optical circuit component of the optical circuits 101. For example, the return optical beam may be directed to an optical detector by a polarization beam splitter. In addition to the mirrors and galvanometers, the optical scanner 102 may include components such as a quarter-wave plate, lens, anti-reflective coated window or the like.

To control and support the optical circuits 101 and optical scanner 102, the LIDAR system 100 includes LIDAR control systems 110. The LIDAR control systems 110 may include a processing device for the LIDAR system 100. In some examples, the processing device may be one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. The processing device may also be one or more special-purpose processing devices such as an application specific integrated circuit (ASIC), a field programmable gate array (FPGA), a digital signal processor (DSP), network processor, or the like.

In some examples, the LIDAR control systems 110 may include a signal processing unit 112 such as a DSP. The LIDAR control systems 110 are configured to output digital control signals to control optical drivers 103. In some examples, the digital control signals may be converted to analog signals through signal conversion unit 106. For example, the signal conversion unit 106 may include a digital-to-analog converter. The optical drivers 103 may then provide drive signals to active optical components of optical circuits 101 to drive optical sources such as lasers and amplifiers. In some examples, several optical drivers 103 and signal conversion units 106 may be provided to drive multiple optical sources.

The LIDAR control systems 110 are also configured to output digital control signals for the optical scanner 102. A motion control system 105 may control the galvanometers of the optical scanner 102 based on control signals received from the LIDAR control systems 110. For example, a digital-to-analog converter may convert coordinate routing information from the LIDAR control systems 110 to signals interpretable by the galvanometers in the optical scanner 102. In some examples, a motion control system 105 may also return information to the LIDAR control systems 110 about the position or operation of components of the optical scanner 102. For example, an analog-to-digital converter may in turn convert information about the galvanometers' position to a signal interpretable by the LIDAR control systems 110.

The LIDAR control systems 110 are further configured to analyze incoming digital signals. In this regard, the LIDAR system 100 includes optical receivers 104 to measure one or more beams received by optical circuits 101. For example, a reference beam receiver may measure the amplitude of a reference beam from the active optical component, and an analog-to-digital converter converts signals from the reference receiver to signals interpretable by the LIDAR control systems 110. Target receivers measure the optical signal that carries information about the range and velocity of a target in the form of a beat frequency, modulated optical signal. The reflected beam may be mixed with a second signal from a local oscillator. The optical receivers 104 may include a high-speed analog-to-digital converter to convert signals from the target receiver to signals interpretable by the LIDAR control systems 110. In some examples, the signals from the optical receivers 104 may be subject to signal conditioning by signal conditioning unit 107 prior to receipt by the LIDAR control systems 110. For example, the signals from the optical receivers 104 may be provided to an operational amplifier for amplification of the received signals and the amplified signals may be provided to the LIDAR control systems 110.

In some applications, the LIDAR system 100 may additionally include one or more imaging devices 108 configured to capture images of the environment, a global positioning system 109 configured to provide a geographic location of the system, or other sensor inputs. The LIDAR system 100 may also include an image processing system 114. The image processing system 114 can be configured to receive the images and geographic location, and send the images and location or information related thereto to the LIDAR control systems 110 or other systems connected to the LIDAR system 100.

In operation according to some examples, the LIDAR system 100 is configured to use nondegenerate optical sources to simultaneously measure range and velocity across two dimensions. This capability allows for real-time, long range measurements of range, velocity, azimuth, and elevation of the surrounding environment.

In some examples, the scanning process begins with the optical drivers 103 and LIDAR control systems 110. The LIDAR control systems 110 instruct, e.g., via signal processor unit 112, the optical drivers 103 to independently modulate one or more optical beams, and these modulated signals propagate through the optical circuits 101 to the free space optics 115. The free space optics 115 directs the light at the optical scanner 102 that scans a target environment over a preprogrammed pattern defined by the motion control system 105. The optical circuits 101 may also include a polarization wave plate (PWP) to transform the polarization of the light as it leaves the optical circuits 101. In some examples, the polarization wave plate may be a quarter-wave plate or a half-wave plate. A portion of the polarized light may also be reflected back to the optical circuits 101. For example, lensing or collimating systems used in LIDAR system 100 may have natural reflective properties or a reflective coating to reflect a portion of the light back to the optical circuits 101.

Optical signals reflected back from an environment pass through the optical circuits 101 to the optical receivers 104. Because the polarization of the light has been transformed, it may be reflected by a polarization beam splitter along with the portion of polarized light that was reflected back to the optical circuits 101. In such scenarios, rather than returning to the same fiber or waveguide serving as an optical source, the reflected signals can be reflected to separate optical receivers 104. These signals interfere with one another and generate a combined signal. The combined signal can then be reflected to the optical receivers 104. Also, each beam signal that returns from the target environment may produce a time-shifted waveform. The temporal phase difference between the two waveforms generates a beat frequency measured on the optical receivers 104 (e.g., photodetectors).

The analog signals from the optical receivers 104 are converted to digital signals by the signal conditioning unit 107. These digital signals are then sent to the LIDAR control systems 110. A signal processing unit 112 may then receive the digital signals to further process and interpret them. In some embodiments, the signal processing unit 112 also receives position data from the motion control system 105 and galvanometers (not shown) as well as image data from the image processing system 114. The signal processing unit 112 can then generate 3D point cloud data that includes information about range and/or velocity points in the target environment as the optical scanner 102 scans additional points. The signal processing unit 112 can also overlay 3D point cloud data with image data to determine velocity and/or distance of objects in the surrounding area. The signal processing unit 112 also processes the satellite-based navigation location data to provide data related to a specific global location.

Figure 2:
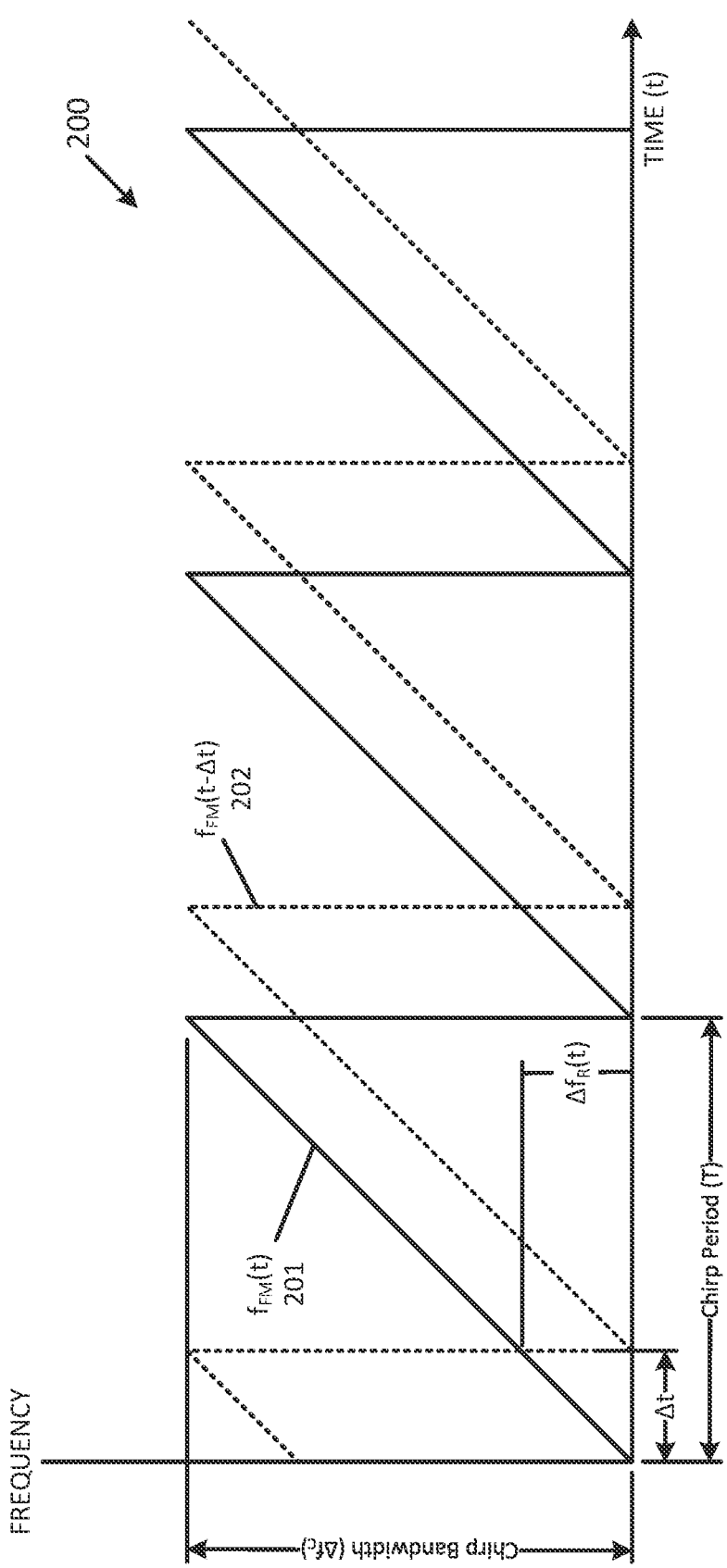
FIG. 2 is a time-frequency diagram illustrating one example of LIDAR waveforms according to embodiments of the present disclosure.

FIG. 2 is a time-frequency diagram 200 of an FMCW scanning signal 201 that can be used by a LIDAR system, such as system 100, to scan a target environment according to some embodiments. In one example, the scanning waveform 201, labeled as $f_{FM}(t)$, is a sawtooth waveform (sawtooth "chirp") with a chirp bandwidth $\Delta f_C$ and a chirp period $T_C$. The slope of the sawtooth is given as $k=(\Delta f_C/T_C)$. FIG. 2 also depicts target return signal 202 according to some embodiments. Target return signal 202, labeled as $f_{FM}(t-\Delta t)$, is a time-delayed version of the scanning signal 201, where $\Delta t$ is the round trip time to and from a target illuminated by scanning signal 201. The round trip time is given as $\Delta t=2R/v$, where R is the target range and v is the velocity of the optical beam, which is the speed of light c. The target range, R, can therefore be calculated as $R=c(\Delta t/2)$. When the return signal 202 is optically mixed with the scanning signal, a range dependent difference frequency ("beat frequency") $\Delta f_R(t)$ is generated. The beat frequency $\Delta f_R(t)$ is linearly related to the time delay $\Delta t$ by the slope of the sawtooth k. That is, $\Delta f_R(t)=k\Delta t$. Since the target range R is proportional to $\Delta t$, the target range R can be calculated as $R=(c/2)(\Delta f_R(t)/k)$. That is, the range R is linearly related to the beat frequency $\Delta f_R(t)$. The beat frequency $\Delta f_R(t)$ can be generated, for example, as an analog signal in optical receivers 104 of system 100. The beat frequency can then be digitized by an analog-to-digital converter (ADC), for example, in a signal conditioning unit such as signal conditioning unit 107 in LIDAR system 100. The digitized beat frequency signal can then be digitally processed, for example, in a signal processing unit, such as signal processing unit 112 in system 100. It should be noted that the target return signal 202 will, in general, also includes a frequency offset (Doppler shift) if the target has a velocity relative to the LIDAR system 100. The Doppler shift can be determined separately, and used to correct the frequency of the return signal, so the Doppler shift is not shown in FIG. 2 for simplicity and ease of explanation. It should also be noted that the sampling frequency of the ADC will determine the highest beat frequency that can be processed by the system without aliasing. In general, the highest frequency that can be processed is one-half of the sampling frequency (i.e., the "Nyquist limit"). In one example, and without limitation, if the sampling frequency of the ADC is 1 gigahertz, then the highest beat frequency that can be processed without aliasing ($\Delta f_{Rmax}$) is 500 megahertz. This limit in turn determines the maximum range of the system as $R_{max}=(c/2)(\Delta f_{Rmax}/k)$ which can be adjusted by changing the chirp slope k. In one example, while the data samples from the ADC may be continuous, the subsequent digital processing described below may be partitioned into "time segments" that can be associated with some periodicity in the LIDAR system 100. In one example, and without limitation, a time segment might correspond to a predetermined number of chirp periods T, or a number of full rotations in azimuth by the optical scanner.

Figure 3A:
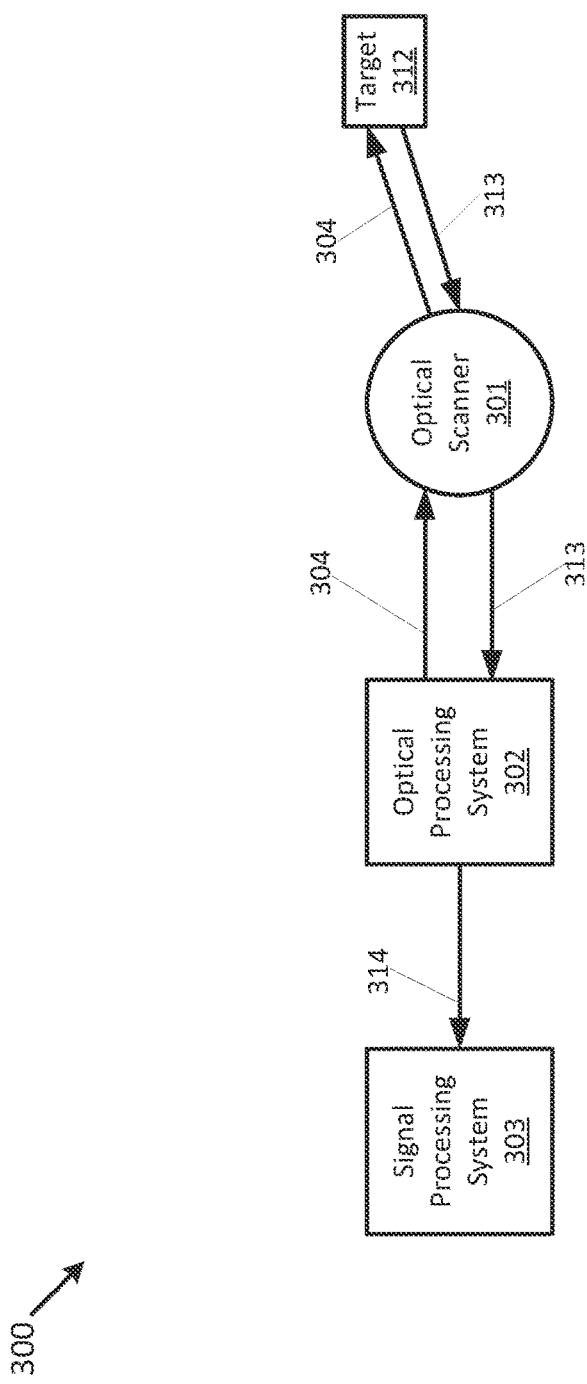
FIG. 3A is a block diagram illustrating an example LIDAR system according to embodiments of the present disclosure.

FIG. 3A is a block diagram illustrating an example FMCW LIDAR system 300 according to the present disclosure. Example system 300 includes an optical scanner 301 to transmit an FMCW (frequency-modulated continuous wave) infrared (IR) optical beam 304 and to receive a return signal 313 from reflections of the optical beam 304 from targets such as target 312 in the field of view (FOV) of the optical scanner 301. System 300 also includes an optical processing system 302 to generate a baseband signal 314 in the time domain from the return signal 313, where the baseband signal 314 contains frequencies corresponding to LIDAR target ranges. Optical processing system 302 may include elements of free space optics 115, optical circuits 101, optical drivers 103 and optical receivers 104 in LIDAR system 100. System 300 also includes a signal processing system 303 to measure energy of the baseband signal 314 in the frequency domain, to compare the energy to an estimate of LIDAR system noise, and to determine a likelihood that a signal peak in the frequency domain indicates a detected target. Signal processing system 303 may include elements of signal conversion unit 106, signal conditioning unit 107, LIDAR control systems 110 and signal processing unit 112 in LIDAR system 100.

Figure 3B:
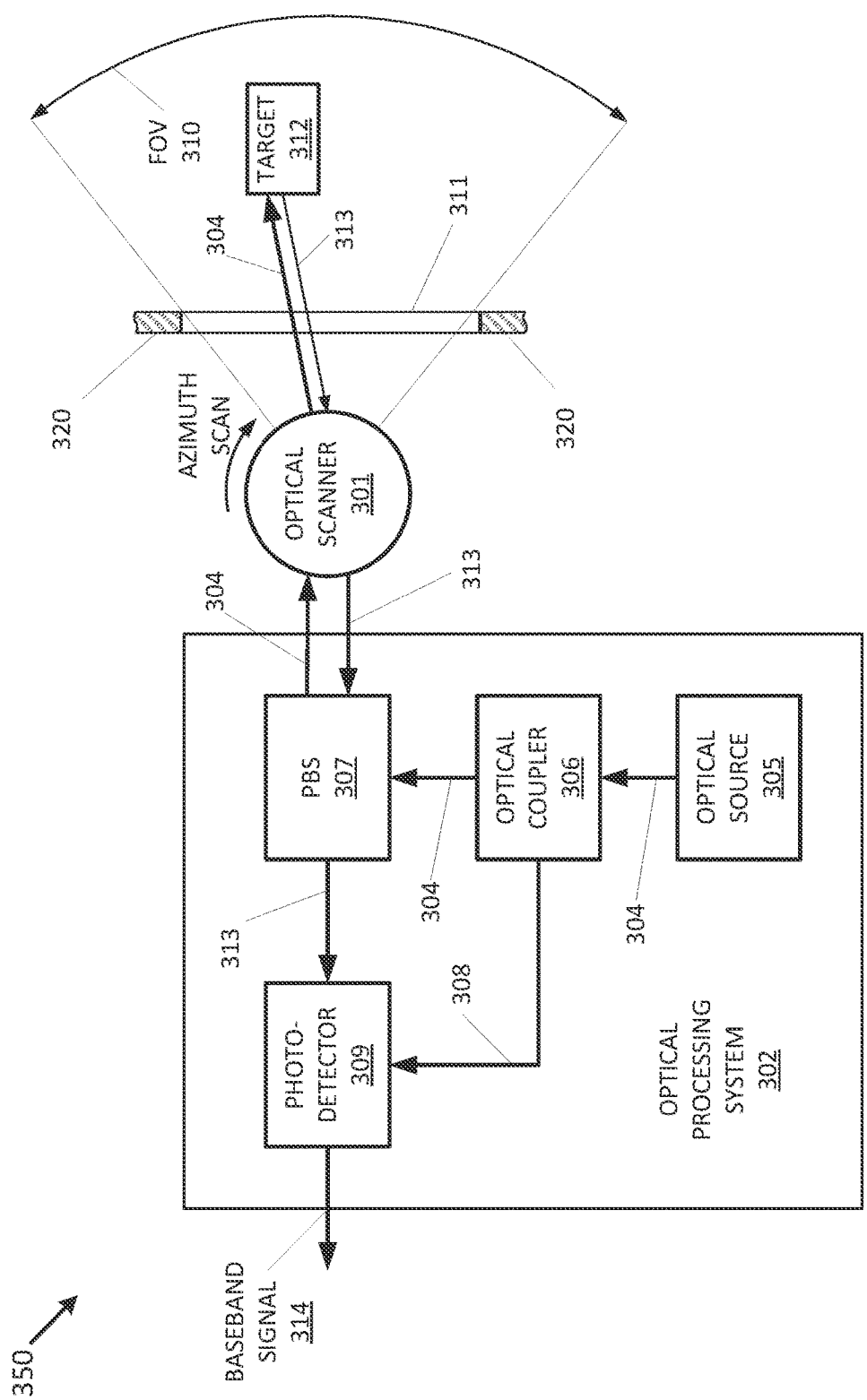
FIG. 3B is a block diagram illustrating an electro-optical optical system according to embodiments of the present disclosure.

FIG. 3B is a block diagram illustrating an example electro-optical system 350. Electro-optical system 350 includes the optical scanner 301, similar to the optical scanner 102 illustrated and described in relation to FIG. 1. Electro-optical system 350 also includes the optical processing system 302, which as noted above, may include elements of free space optics 115, optical circuits 101, optical drivers 103, and optical receivers 104 in LIDAR system 100.

Electro-optical processing system 302 includes an optical source 305 to generate the frequency-modulated continuous-wave (FMCW) optical beam 304. The optical beam 304 may be directed to an optical coupler 306 that is configured to couple the optical beam 304 to a polarization beam splitter (PBS) 307 and a sample 308 of the optical beam 304 to a photodetector (PD) 309. The PBS 307 is configured to direct the optical beam 304, because of its polarization, toward the optical scanner 301. Optical scanner 301 is configured to scan a target environment with the optical beam 304, through a range of azimuth and elevation angles covering the field of view (FOV) 310 of a LIDAR window 311 in an enclosure 320 of the optical system 350. In FIG. 3B, for ease of illustration, only the azimuth scan is illustrated.

As shown in FIG. 3B, at one azimuth angle (or range of angles), the optical beam 304 passes through the LIDAR window 311 and illuminates a target 312. A return signal 313 from the target 312 passes through LIDAR window 311 and is directed by optical scanner 301 back to the PBS 307.

The return signal 313, which will have a different polarization than the optical beam 304 due to reflection from the target 312, is directed by the PBS 307 to the photodetector (PD) 309. In PD 309, the return signal 313 is optically mixed with the local sample 308 of the optical beam 304 to generate a range-dependent baseband signal 314 in the time domain. The range-dependent baseband signal 314 is the frequency difference between the local sample 308 of the optical beam 304 and the return signal 313 versus time (i.e., $\Delta f_R(t)$).

Figure 4:
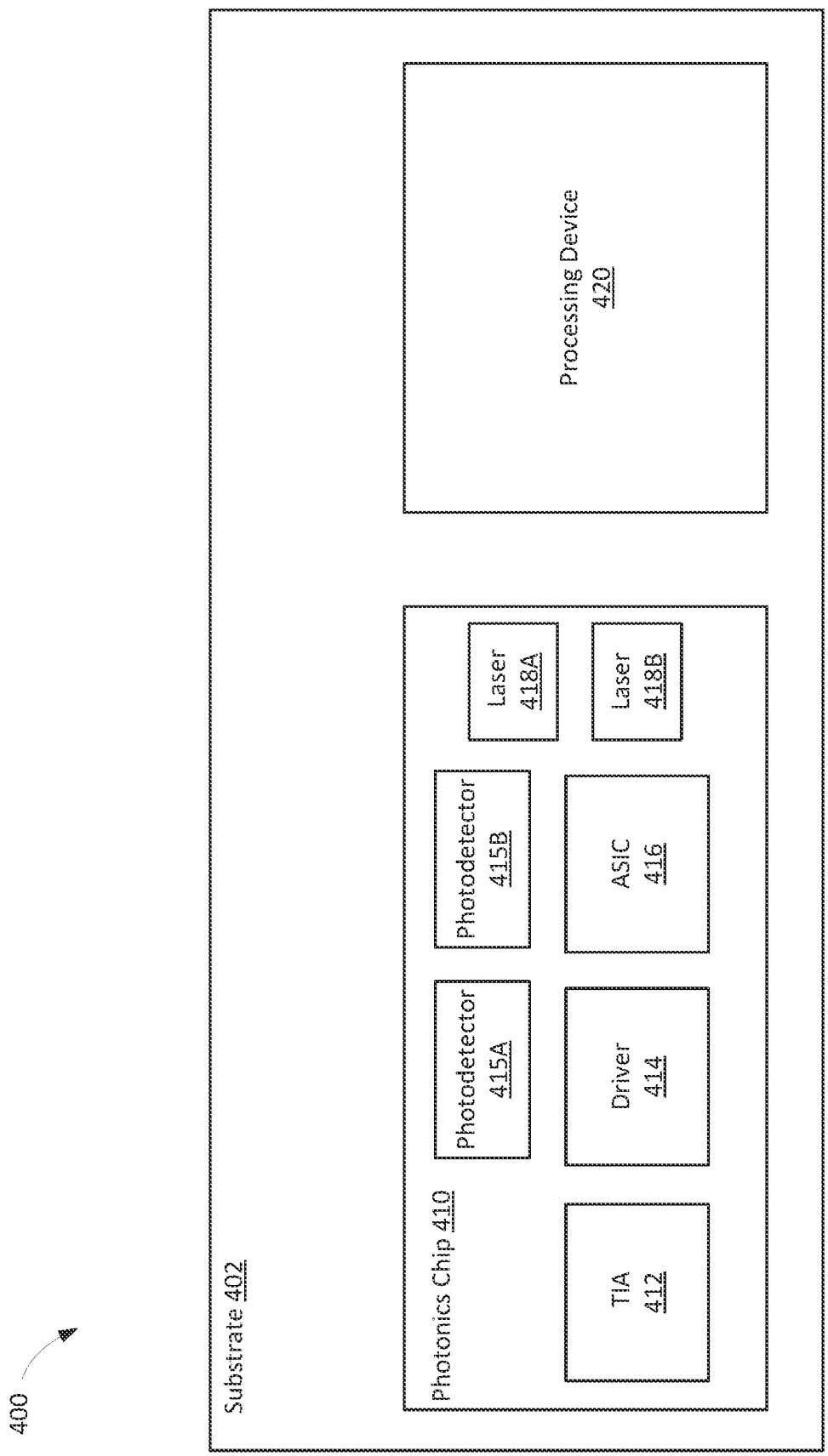
FIG. 4 is a top view of an optical sensing apparatus packaged on a substrate according to embodiments of the present disclosure.

FIG. 4 is a block diagram of an optical sensing system 400 (e.g., LIDAR system), according to some embodiments of the disclosure. As depicted, apparatus 400 includes a photonics chip 410 that is coupled to a substrate 402. In one example, the substrate 402 may be a printed circuit board (PCB) or similar electronics board. In some embodiments, the photonics chip 410 may be a flip-chip attached to the PCB, as described below with respect to FIG. 5. The photonics chip 410 may be a silicon photonics chip or similar type of photonics chip. In some embodiments, one or more active and passive optical components may be integrated in the photonics chip 410, as described above with respect to FIG. 1. In some embodiments, photonics chip 410 may be, or may include, an optical processing system such as optical processing system 302 as described with respect to FIGS. 3A-B, and may include elements of free space optics 115, optical circuits 101, optical drivers 103 and optical receivers 104 in LIDAR system 100, as described with respect to FIG. 1. For example, the photonics chip 410 may include one or more optical sources (e.g., lasers 418A-B) to generate one or more optical beams, one or more waveguides for directing the optical beams generated by the optical sources through the photonics chip, a heater, and a modulator.

According to some embodiments, photonics chip 410 may further include an edge coupler and/or grating couplers at an edge or surface of the photonics chip 410 for emitting a plurality of optical beams from the photonics chip 410 and one or more photodetectors 415A-B for detecting return signals (e.g., optical signals reflected from a target in the field of view of the LIDAR system), as described above with respect to FIG. 3B.

Photonics chip 410 may further include any other active or passive optical components used by a LIDAR system. In some embodiments, one or more additional electronics chips may be coupled to a surface of the photonics chip 410. For example, a trans-impedance amplifier (TIA) 412, a driver 414, application specific integrated circuits (ASIC) 416, or any number of electronics chips may be attached to a surface of the photonics chip 410. TIA 412 may be a current to voltage converter to amplify the output of the PDs 415A-B. Additionally, lasers 418A-B (e.g., laser diodes) may be a laser chip integrated at a surface of the photonics chip 410. The electronics chips may be soldered to a surface of the photonics chip 410, wire bonded, or attached to the photonics chip 410 in any other manner providing an electrical connection among the electronics chips and the photodetectors 415A-B.

In some embodiments, the photonics chip 410 may be attached to the substrate 402 by the bottom, or back, of the photonics chip 410. In such an embodiment, the photonics chip 410 may include through-silicon vias (TSVs) through the photonics chip 410 to electrically couple the electronics chips to the substrate 402, as described below with respect to FIG. 6. The substrate 402 may be a printed circuit board (PCB). In some embodiments, the substrate 402 may be a multi-layer organic type high density interconnect substrate based on Build Up Technology (BUT), or Sequential Build Up technology. In some embodiments, the substrate may be a ceramics multilayer type, such as a Low Temperature Co-Fired Ceramics (LTCC) multi-layer glass ceramic substrate which is co-fired with low resistance metal conductors at low firing temperature.

Additionally, in some embodiments a processing device 420 may be coupled to the substrate 402. The substrate 402 may include electrical traces (e.g., copper traces or any other electrically conductive material) for electrically coupling the photonics chip 410 and the processing device 420. The processing device 420 may be configured to process digital and/or electrical signals generated by the photonics chip 410 and the electronics chips coupled to the photonics chip 410. For example, the processing device 420 may be communicatively and/or operatively coupled to the photonics chip 410 via substrate 402 (e.g., via a printed circuit board) as described in more detail below with respect to FIGS. 5 and 6. In one example, the processing device 420 may be a digital-signal processor, a central processing unit (CPU), a field programmable gate array (FPGA) or similar processing device. The processing device 420 may be configured to calculate a distance and/or a velocity of one or more targets within a field of view of the photonics chip 410 using one or more electrical signals received from the photonics chip 410.

Figure 5:
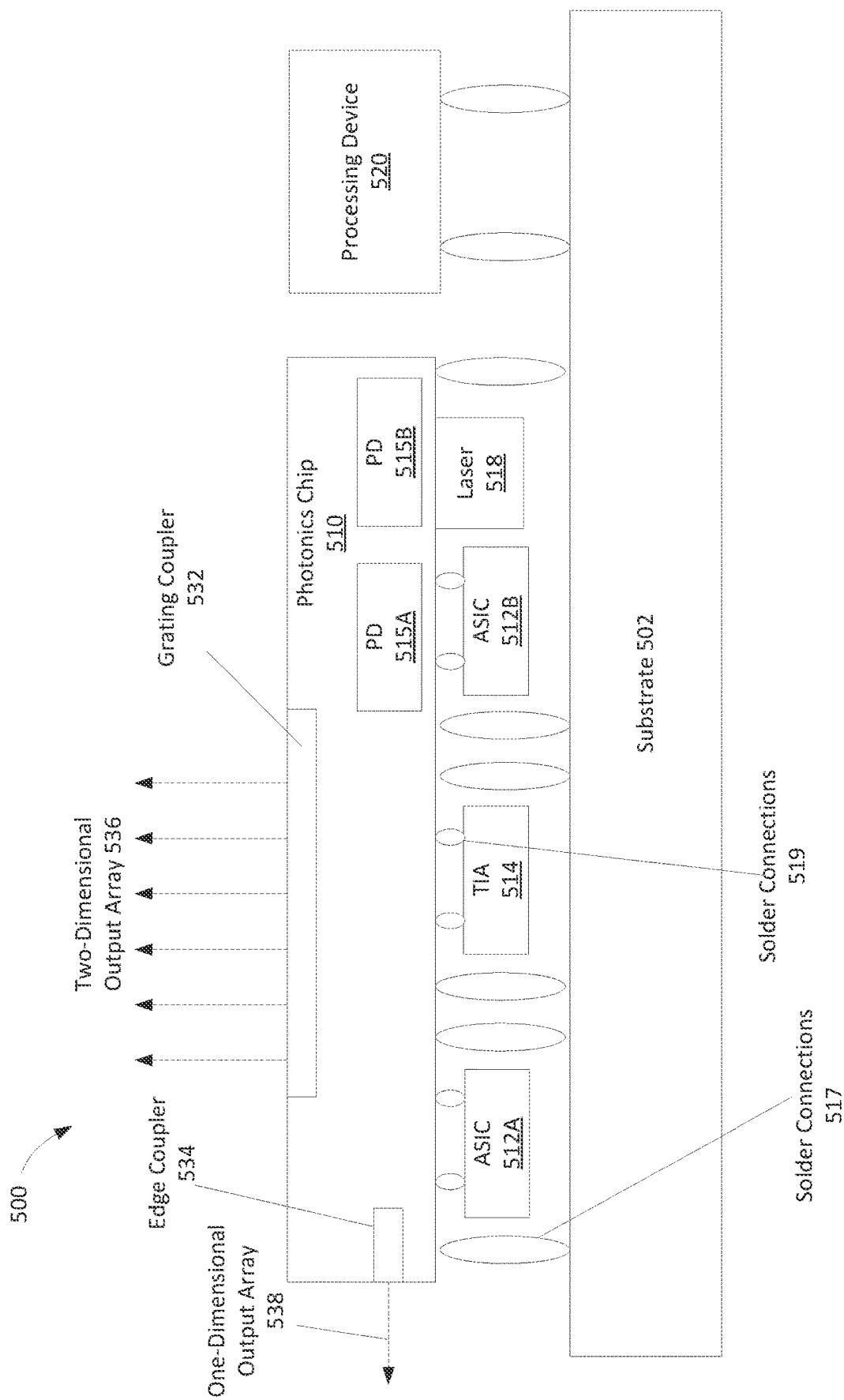
FIG. 5 is a side view of an optical sensing device flip-chip bonded to a substrate according to some embodiments.

FIG. 5 is a side view of an optical sensing device 500 according to some embodiments. In one example, electronic chips for signal processing may be coupled to a photonics chip 510. For example, a laser 518 may first be attached to the photonics chip 510 followed by additional electronics chips such as ASICs 512A-B and TIA 514. ASICs 512A-B and TIA 514 may be attached to the photonics chip via solder connections 519. As depicted in FIG. 5, the photonics chip may be flip-chip bonded to substrate 502. Flip-chip bonding, also known as controlled collapse chip connection (C4), may refer to attaching a semiconductor die (e.g., a chip) to a substrate by inverting the die and attaching the die face-down on the substrate. The electrical connections between the substrate and the die may be made through solder bumps such as tin-silver-copper (SAC), conductive polymer bumps, etc. For example, to attach the photonics chip 510 to the substrate 502, solder balls, or bumps, may be placed on the photonics chip at locations corresponding to leads on the substrate 502 (e.g., PCB). The photonics chip 510 may then be placed on the substrate 502 at which point the solder balls may be reflowed to attach the photonics chip 510 to the substrate 502 (e.g., via solder connections 517).

Accordingly, the photonics chip 510, the electronic chips, and the processing device 520 may be integrated into a single compact form factor. The bonds between the electronic chips and the photonics chip 510 and the bonds between the photonics chip 510 and the substrate 502 may be tens of microns in size (e.g., 10-100 microns). Thus, the distance between the chips may also be tens of microns. This reduced distance between the electronic chips, the photonics chip 510, and the substrate 502 may reduce the electrical crosstalk between electrical components and thus reduce the noise in the electrical circuits of the LIDAR system. Reduced noise may correspondingly increase signal-to-noise ratio (SNR) of detected return signals and the likelihood of detecting a target from the return signals.

In some embodiments, the photonics chip 510 may include one or more waveguides to direct an optical beam produced by the laser 518 into and through the photonics chip 510. The waveguides may direct the optical beam through the photonics chip 510 to an edge coupler 534 and/or a grating coupler 532 together with one or more built-in mirrors from which the optical beam can be emitted to free space and directed toward one or more targets in a field of view of the photonics chip 510. The grating coupler may be located on the front side of the photonics chip 510 to allow the light to be emitted to an external environment from the front side of the photonics chip 510. In some embodiments, the photonics chip 510 may further include one or more built-in mirrors to deflect the light array to be emitted from the back-side of the photonics chip 510. In one example, the edge coupler 534 may provide a one-dimensional optical beam output array 538. Edge coupler 534 may emit the output array from an edge of the photonics chip 510 (e.g., from the short edge of the photonics chip 510 and parallel with the plane of the photonics chip 510). In one example, the grating coupler 532 together with the one or more built-in mirrors provide a two-dimensional optical beam output array 536 from the back of the photonics chip 510. For example, the two-dimensional output array 536 may be a lattice of output beams.

The optical beam is then reflected from one or more targets and returned to the photonics chip. The waveguides, along with other optical elements (e.g., PBS), may then direct the return signal to one or more photodetectors (PDs) 515A-B where the return signal is combined with a LO to generate an electrical signal. The PDs 515A-B may be electrically coupled to the ASICs 512A-B and TIA 514 to amplify, transform, and process the electrical signal produced by the PDs 515A-B. Processing device 520 may also be attached to the substrate 502 via solder connections 517. Processing device 520 may be electrically coupled to the photonics chip 510 and the electronics chips coupled to the photonics chip 510 via the substrate 502.

Figure 6:
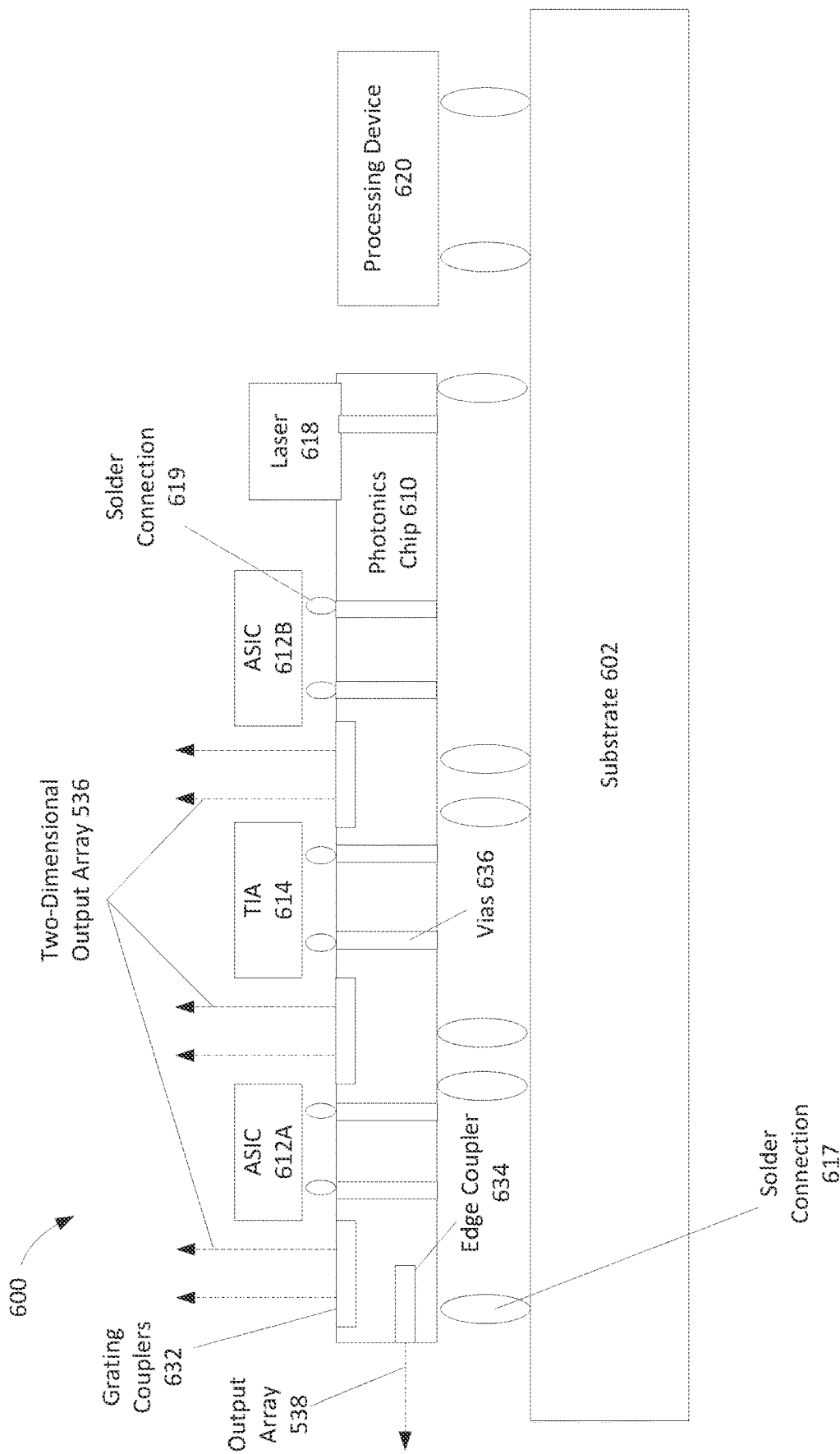
FIG. 6 is a side view of an optical sensing device bonded to a substrate according to some embodiments.

FIG. 6 is a side view of an optical sensing device 600 according to some embodiments. In one example, electronics chips for signal processing may be coupled to a photonics chip 610. For example, a laser 618 may first be attached to the photonics chip 610 followed by additional electronics chips such as ASICs 612A-B and TIA 614. ASICs 612A-B and TIA 614 may be attached to the photonics chip with solder connections 619. The photonics chip 610 may include one or more vias 636, also referred to as through-silicon vias (TSVs) or through-chip vias. The vias 636 may provide an electrical connection from the substrate 602 to the electronics chips (e.g., ASIC 612A-B, TIA 614, and laser 618) attached to the top surface of the photonics chip 610. The photonics chip 610 may act as an interposer between the circuits on the substrate 602 and the chips on the top surface of the photonics chip 610. In an alternative embodiment, the chips may be wire bonded to the circuits of the substrate 602.

In some embodiments, the photonics chip 610 may include one or more waveguides to direct an optical beam produced by the laser 618 into and through the photonics chip 610. The waveguides may direct the optical beam through the photonics chip 610 to an edge coupler 634 and/or a grating coupler 632 from which the optical beam can be emitted to free space and directed toward one or more targets in a field of view of the photonics chip 610. In one example, the edge coupler 634 may provide a one-dimensional optical beam output array 638. Edge coupler 634 may emit the one-dimensional output array 638 from an edge of the photonics chip 610 (e.g., from the short edge of the photonics chip 610 and parallel with the plane of the photonics chip 610). In one example, the grating coupler 632 provides a two-dimensional optical beam output array from the front of the photonics chip 610. For example, the two-dimensional output array 636 may be a lattice of output beams. The two-dimensional output array 636 may be output around and between the electronic chips disposed on the front of the photonics chip 610.

The optical beam is then reflected from one or more targets and returned to the photonics chip 610. The waveguides, along with other optical elements (e.g., PBS), may then direct the return signal to one or more photodetectors (PDs) where the return signal is combined with a LO to generate an electrical signal. The PDs may be electrically coupled to the ASICs 612A-B and TIA 614 to amplify, transform, and process the electrical signal produced by the PDs. Processing device 620 may also be attached to the substrate 602 via solder connections 617. Processing device 620 may be electrically coupled to the photonics chip and the electronics chips coupled to the photonics chip 610 via the substrate 602.

Referring to both FIG. 5 and FIG. 6 the solder connections 519 and 619 may be performed by chip-to-chip connection (e.g., first chip is TIA or ASIC chip, second chip is the photonics chip), or chip-to-wafer (e.g., the chip is TIA or ASIC chip, and the wafer is silicon photonics wafer) using C4 solder joints, or small pitch copper pillar solder joints. The bonding position tolerance may be in the less than ten microns range. The solder connections 517 and 617 between photonics chip to substrate may be performed using C4 solder bumps with positional tolerance may be a couple of tens of microns range. The bonding of the laser chip to the photonics chip may have a sub-micron position tolerance in each of the x/y/z directions to provide high coupling efficiency to send the light from laser to silicon photonics waveguides.

Figure 7A:
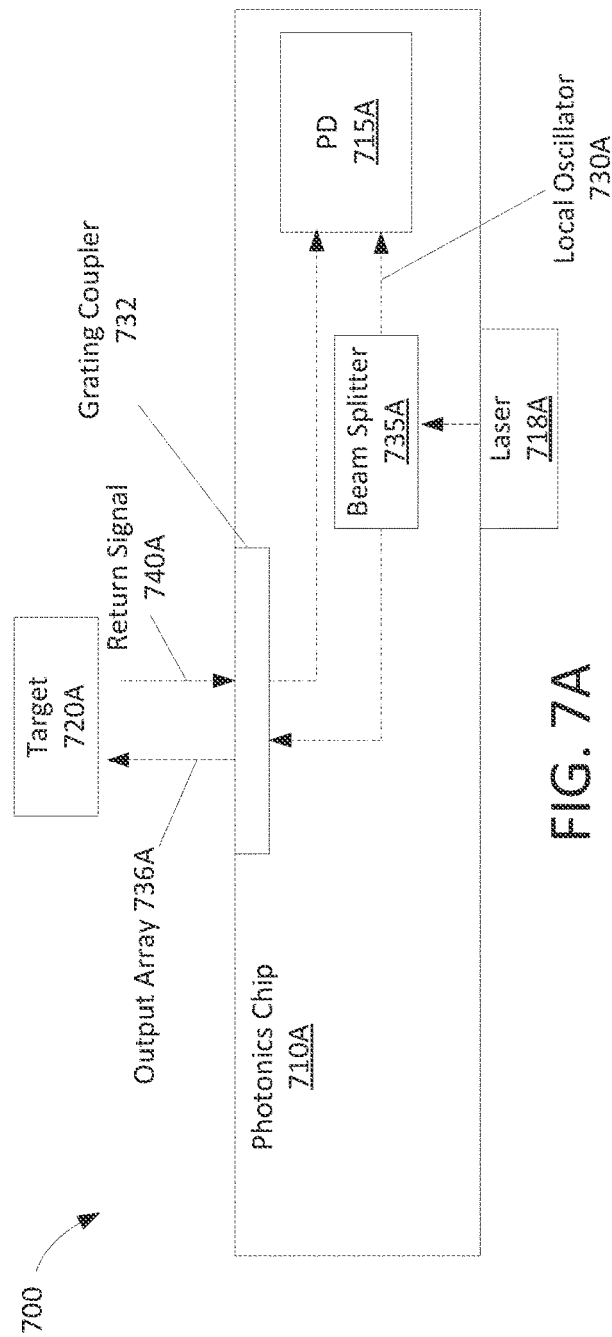
FIG. 7A is a side view of a photonics chip illustrating an optical path of an optical beam, according to embodiments of the present disclosure.

FIG. 7A is a block diagram 700 of a photonics chip 710A illustrating the path for an optical beam according to some embodiments. In one example, a laser 718A (e.g., a laser diode) generates an optical beam (e.g., light). The optical beam may be sent into the photonics chip 710A through a light coupling component (e.g., an edge coupling or grating coupling). The optical beam travels inside the silicon chip via a waveguide. A waveguide may be similar to an optical version of an electrical circuit where electrons travel inside. The optical beam is then emitted from the photonics chip 710A to outside world as an output array 736A through grating coupler 732.

When the output array 736A of the optical beam hits an object (e.g., target 720A), a portion of the transmitted optical beam will be reflected in space and some of the reflected light (e.g., return signal 740A) will be reflected back into the photonics chip 710A, through the grating coupler 732. The return signal 740A then travels inside the chip through a waveguide, to a photodetector device (PD) 715A. The return signal 740A is converted to an electrical signal (e.g., a current signal). Additionally, after the optical beam is sent into the photonics chip 710A and prior to being transmitted to the target 720A, a portion of the optical beam may be split (e.g., by a beam splitter 735A) to generate a local oscillator (LO) 730A. The LO 730A travels inside the photonics chip 710A. When the small error caused by a possible Doppler frequency shift is ignored and the power of the transmitted optical beam is linearly frequency modulated, then the time delay, and thus distance to the target 720A, can be calculated as proportional to the difference of the transmitted signal (e.g., the local oscillator 730A) and the return signal 740A at any time.

Figure 7B:
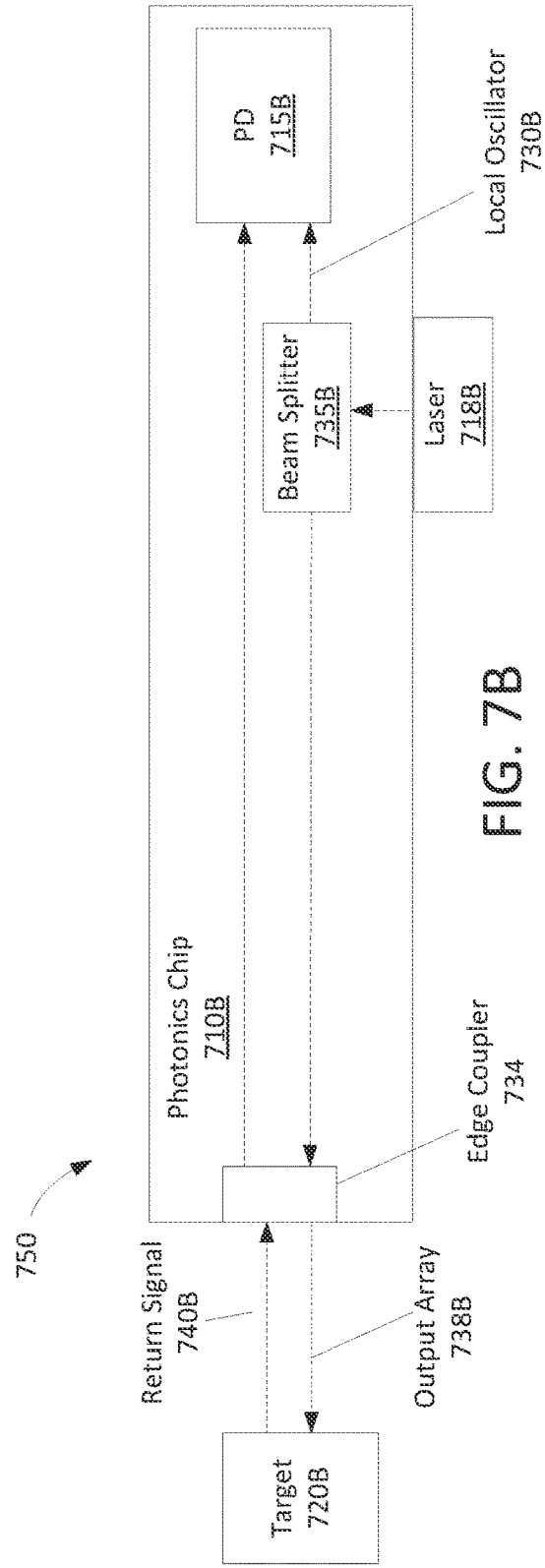
FIG. 7B is a side view of a photonics chip illustrating another optical path of an optical beam, according to embodiments of the present disclosure.

FIG. 7B is a block diagram 750 of a photonics chip 710B illustrating the path for an optical beam according to some embodiments. Diagram 750 may be the same or similar to diagram 700 except for the path of the optical beam and the use of an edge coupler rather than a grating coupler. In one example, a laser 718B (e.g., a laser diode) generates an optical beam (e.g., light). The optical beam may be sent into the photonics chip 710B through a light coupling component (e.g., an edge coupling or grating coupling). The optical beam travels inside the photonics chip 710B via a waveguide. A waveguide may be similar to an optical version of an electrical circuit where electrons travel inside. The optical beam is then emitted from the photonics chip 710B to an external environment as an output array 736B through edge coupler 734.

When the output array 736B of the optical beam hits an object (e.g., target 720B), a portion of the transmitted optical beam will be reflected in space and some of the reflected light (e.g., return signal 740B) will be reflected back into the photonics chip 710B, through the edge coupler 734. The return signal 740B then travels inside the chip through a waveguide, to a photodetector device (PD) 715B. The return signal 740B is converted to an electrical signal (e.g., a current signal). Additionally, after the optical beam is sent into the photonics chip 710B and prior to being transmitted to the target 720B, a portion of the optical beam may be split (e.g., by a beam splitter 735B) to generate a local oscillator (LO) 730B. The LO 730B travels inside the photonics chip 710B. When the small error caused by a possible Doppler frequency shift is ignored and the power of the transmitted optical beam is linearly frequency modulated, then the time delay, and thus distance to the target 720B, can be calculated as proportional to the difference of the transmitted signal (e.g., the local oscillator 730B) and the return signal 740B at any time. It should be noted that although depicted as separate embodiments in diagram 700 and diagram 750, a photonics chip may include both grating coupler 732 and edge coupler 734 together in some embodiments (e.g., as depicted in FIGS. 5 and 6).

Figure 8:
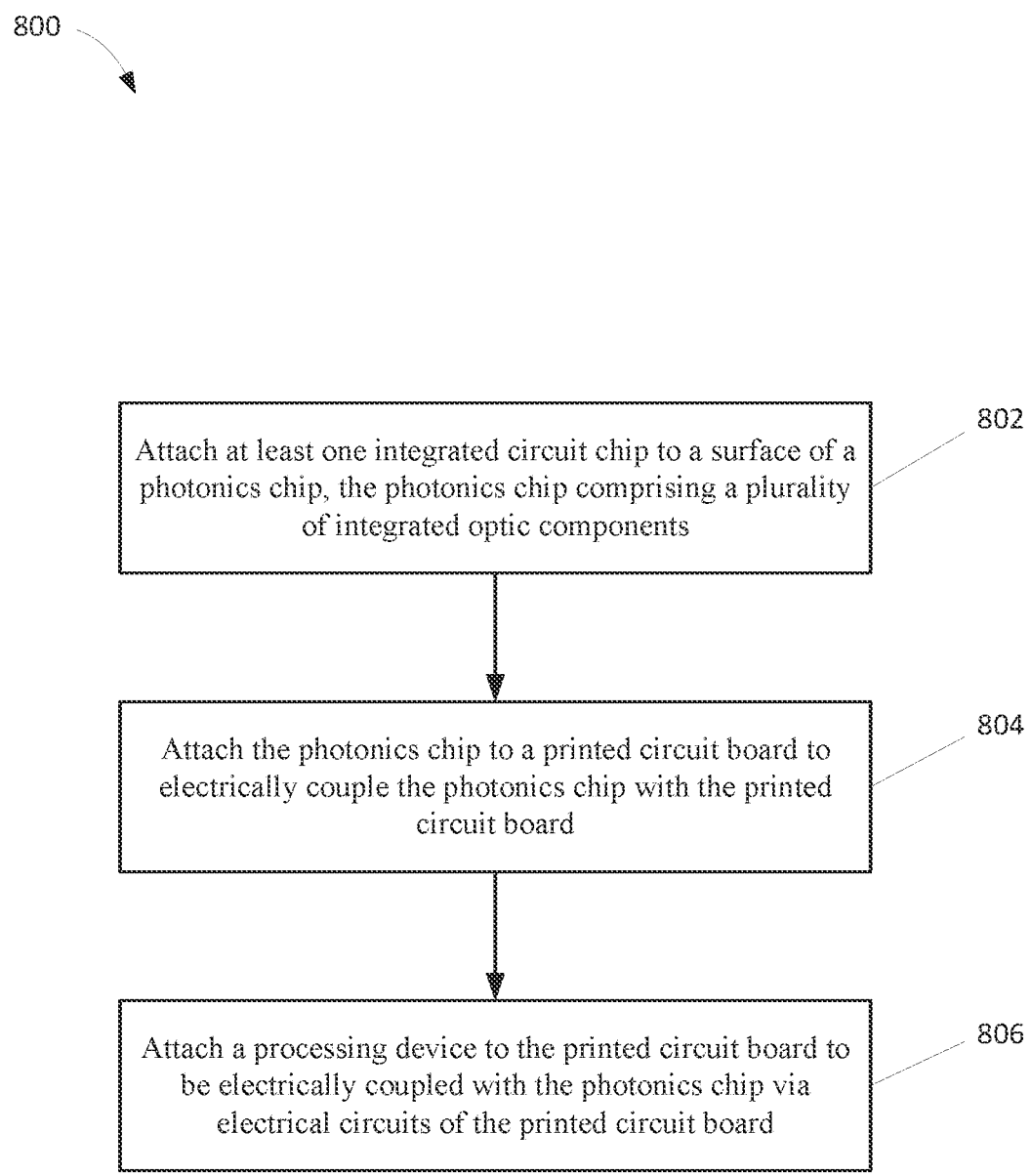
FIG. 8 is a flow diagram of a method of manufacturing an optical sensing device, according to some embodiments.

FIG. 8 is a flowchart illustrating a method 800 of manufacturing a compact optical sensing module with hybrid multi-chip integration, according to some embodiments. Method 800 begins at block 802, where at least one integrated circuit chip is attached to a surface of a photonics chip, the photonics chip including a set of integrated optic components. The integrated circuit chip may include a TIA, one or more ASICs, a processing device, such as a CPU, GPU, digital signal processor, FPGA, or any other processing device, etc. The photonics chip may be a silicon photonics chip including passive or active optical components such as an optical source, waveguides for directing one or more optical beams, edge couplers, etc. The photonics chip may emit the optical beams which may be reflected from targets in the field of view of the photonics chip. The photonics chip may receive and detect the return signals and generate an electrical signal.

At block 804, the photonics chip is attached to a printed circuit board to electrically couple the photonics chip with the printed circuit board. In one example, the photonics chip may be coupled to electrical connections of the printed circuit board. In some embodiments, the photonics chip may be soldered to the printed circuit board using two-dimensional or three dimensional wafer scale techniques, such as flip-chip bonding or TSVs.

At block 806, a processing device is attached to the printed circuit board to be electrically coupled with the photonics chip via electrical circuits of the printed circuit board. The processing device may process analog or digital electrical signals received from the photonics chip. For example, the processing device may identify a target from the electrical signals and determine a distance to the target and a velocity of the target.

Figure 9:
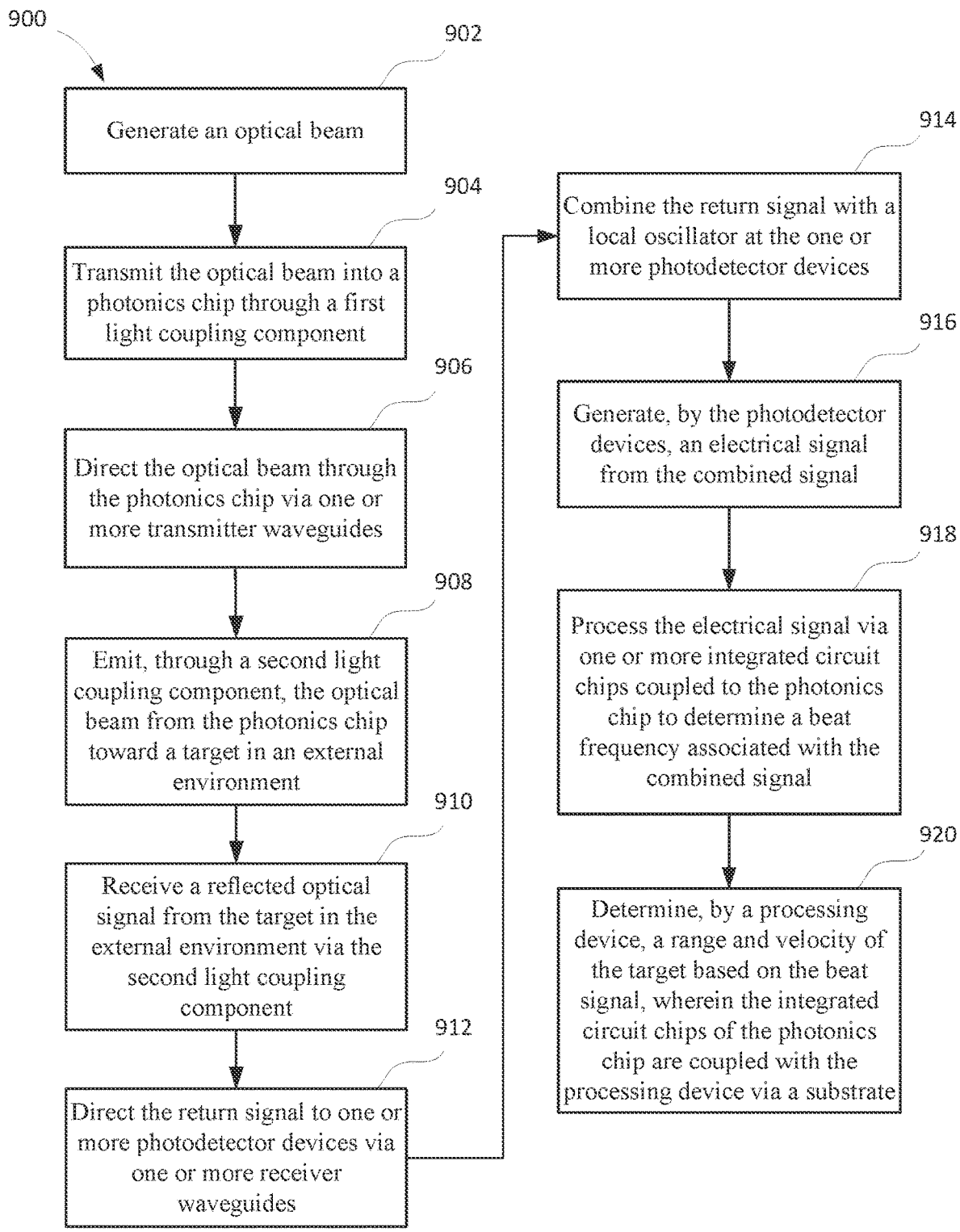
FIG. 9 is a flow diagram of a method of operation of an optical sensing device, according to some embodiments.

FIG. 9 is a flowchart illustrating a method 900 of operating of a LIDAR system with a compact optical sensing module with hybrid multi-chip integration, according to some embodiments. Method 900 begins at block 902 where a laser (e.g. a laser diode chip coupled to a photonics chip) generates an optical beam. At block 904, the optical beam is transmitted into a photonics chip through a first light coupling component. At block 906, the optical beam is directed through photonics chip via one or more transmitter waveguides. At block 908, the optical beam is emitted from the photonics chip through a second light coupling component (e.g., an edge coupler or a grating coupler).

At block 910, a reflected optical signal is received from the target via the second light coupling component. At block 912, the return optical signal is directed to one or more photodetector devices (PDs) via one or more receiver waveguides. At block 914, the return optical signal is combined with a local oscillator at or before the PDs resulting in a beat frequency. At block 916, the one or more PDs generate an electrical signal from the combined signal. At block 918, the electrical signal is processed via one or more integrated circuit (IC) chips coupled to the photonics chip to determine a beat frequency resulting from the combined signal. The IC chips may be attached (e.g., soldered) to a surface of the photonics chip. At block 920, a processing device determines a range and velocity of the target associated with the return optical signal based on the beat frequency. The processing device may be electronically coupled to the IC chips coupled to the photonics chip via a substrate (e.g., a PCB). For example, the processing device and the photonics chip may be attached to the substrate and the IC chips may be electronically coupled to the substrate, as described above with respect to FIGS. 5-6.

The preceding description sets forth numerous specific details such as examples of specific systems, components, methods, and so forth, in order to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary. Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example.

Although the operations of the methods herein are shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Furthermore, the terms "first," "second," "third," "fourth," etc. as used herein are meant as labels to distinguish among different elements and may not necessarily have an ordinal meaning according to their numerical designation.

The invention claimed is:

1. A light detection and ranging (LIDAR) apparatus, comprising:
 a photonics chip mounted to a substrate, the photonics chip comprising one or more optical components and one or more electrical components; and
 one or more integrated circuit (IC) chips mounted to the photonics chip to process an electrical signal generated by the one or more optical components and the one or more electrical components, wherein the one or more IC chips are physically separated from the substrate to reduce crosstalk on the LIDAR apparatus.

2. The LIDAR apparatus of claim 1, wherein the photonics chip is mounted to the substrate by a first plurality of solder connections and the one or more IC chips are mounted to the photonics chip via a second plurality of solder connections.

3. The LIDAR apparatus of claim 1, wherein the substrate comprises: a printed circuit board (PCB), a multi-layer organic type high density interconnect substrate, or a ceramic multi-layer substrate.

4. The LIDAR apparatus of claim 1, further comprising:
 a processing device operatively coupled to the photonics chip to further process the electrical signal generated by the one or more optical and electrical components of the photonics chip.

5. The LIDAR apparatus of claim 4, wherein the processing device is configured to determine one or more properties of a target in a field of view of the LIDAR apparatus based on the electrical signal generated by the one or more optical and electrical components of the photonics chip.

6. The LIDAR apparatus of claim 1, wherein the photonics chip is flip-chip bonded to the substrate and wherein the one or more IC chips coupled to the photonics chip are disposed between the substrate and the photonics chip.

7. The LIDAR apparatus of claim 1, wherein the photonics chip comprises a plurality of through-silicon vias (TSVs) from a bottom surface of the photonics chip to a top surface of the photonics chip, the plurality of TSVs configured to electrically couple the one or more IC chips disposed on a top surface of the photonics chip to the substrate.

8. The LIDAR apparatus of claim 1, wherein the one or more IC chips comprise at least one application specific integrated circuit (ASIC).

9. The LIDAR apparatus of claim 8, wherein the at least one ASIC comprises: a trans-impedance amplifier (TIA) chip, a laser chip, or a semiconductor optical amplifier (SOA) gain chip.

10. The LIDAR apparatus of claim 1, wherein the photonics chip comprises at least one of an edge coupler to provide a one-dimensional optical output array from the photonics chip or a grating coupler to provide a two-dimensional output array from the photonics chip.

11. A light detection and ranging (LIDAR) system, comprising:
 a photonics chip mounted to a substrate, the photonics chip comprising one or more optical components and one or more electrical components; and
 one or more integrated circuit (IC) chips mounted to the photonics chip to process an electrical signal generated by the one or more optical components and one or more electrical components wherein the one or more IC chips are physically separated from the substrate to reduce crosstalk on the LIDAR system.

12. The LIDAR system of claim 11, wherein the photonics chip is mounted to the substrate by a first plurality of solder connections and the one or more IC chips are mounted to the photonics chip via a second plurality of solder connections.

13. The LIDAR system of claim 12, wherein the substrate comprises: a printed circuit board (PCB), a multi-layer organic type high density interconnect substrate, or a ceramic multi-layer substrate.

14. The LIDAR system of claim 11, further comprising:
a processing device operatively coupled to the photonics chip to further process the electrical signal generated by the one or more optical and electrical components of the photonics chip.

15. The LIDAR system of claim 14, wherein the processing device is configured to determine one or more properties of a target in a field of view of the LIDAR system based on the electrical signal generated by the one or more optical and electrical components of the photonics chip.

16. The LIDAR system of claim 11, wherein the photonics chip is flip-chip bonded to the substrate and wherein the one or more IC chips coupled to the photonics chip are disposed between the substrate and the photonics chip.

17. The LIDAR system of claim 11, wherein the photonics chip comprises a plurality of through-silicon vias (TSVs) from a bottom surface of the photonics chip to a top surface of the photonics chip, the plurality of TSVs configured to electrically couple the one or more IC chips disposed on a top surface of the photonics chip to the substrate.

18. The LIDAR system of claim 11, wherein the one or more IC chips comprise at least one application specific integrated circuit (ASIC).

19. The LIDAR system of claim 18, wherein the at least one ASIC comprises: a trans-impedance amplifier (TIA) chip, a laser chip, or a semiconductor optical amplifier (SOA) gain chip.

20. The LIDAR system of claim 11, wherein the photonics chip comprises at least one of an edge coupler to provide a one-dimensional optical output array from the photonics chip or a grating coupler to provide a two-dimensional output array from the photonics chip.

21. A method comprising:
mounting an integrated circuit (IC) chip to a surface of a photonics chip, the photonics chip comprising one or more optical components and one or more electrical components; and
mounting the photonics chip to a substrate, wherein the IC mounted to the surface of the photonics chip is electrically coupled to the substrate, wherein the one or more IC chips are physically separated from the substrate to reduce crosstalk between the IC chips and electronics of the substrate.

* * * * *